(12) United States Patent
Su et al.

(10) Patent No.: US 9,728,260 B1
(45) Date of Patent: Aug. 8, 2017

(54) LIGHT-ERASABLE EMBEDDED MEMORY DEVICE AND METHOD OF MANUFACTURING THE SAME

(71) Applicant: UNITED MICROELECTRONICS CORP., Hsin-Chu (TW)

(72) Inventors: Hao Su, Singapore (SG); Chow Yee Lim, Singapore (SG); Chao Jiang, Singapore (SG); Hong Liao, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/140,506

(22) Filed: Apr. 28, 2016

(51) Int. Cl.
| | |
|---|---|
| H01L 21/336 | (2006.01) |
| G11C 16/04 | (2006.01) |
| H01L 27/11521 | (2017.01) |
| H01L 29/51 | (2006.01) |
| H01L 21/28 | (2006.01) |
| H01L 21/268 | (2006.01) |
| H01L 23/528 | (2006.01) |
| H01L 23/522 | (2006.01) |

(52) U.S. Cl.
CPC ...... G11C 16/0416 (2013.01); H01L 21/2686 (2013.01); H01L 21/28273 (2013.01); H01L 23/528 (2013.01); H01L 23/5226 (2013.01); H01L 27/11521 (2013.01); H01L 29/518 (2013.01)

(58) Field of Classification Search
CPC ............... H01L 2224/11; H01L 23/481; H01L 23/5258; H01L 27/105; H01L 27/11526; H01L 27/11529; H01L 2924/0002; H01L 2924/00; H01L 2924/00014
See application file for complete search history.

(56) References Cited

U.S. PATENT DOCUMENTS 7,544,992 B2 *  6/2009  Shih .................... H01L 23/5258
                                                  257/323
2013/0087682 A1 *  4/2013  Nomura ................ C09B 23/105
                                                  250/206

* cited by examiner

*Primary Examiner* — Roy Potter
(74) *Attorney, Agent, or Firm* — Winston Hsu (57) ABSTRACT

A light-erasable embedded memory device and a method for manufacturing the same are provided in the present invention. The light-erasable embedded memory device includes a substrate with a memory region and a core circuit region, a floating gate on the memory region of the substrate, at least one light-absorbing film above the floating gate, wherein at least one light-absorbing film is provided with dummy via holes overlapping the floating gate, and a dielectric layer on the light-absorbing film and filling up the dummy via holes.

14 Claims, 9 Drawing Sheets

LIGHT-ERASABLE EMBEDDED MEMORY DEVICE AND METHOD OF MANUFACTURING THE SAME

BACKGROUND OF THE INVENTION

1. Field of the Invention

The present invention relates to a memory device and a fabricating method thereof. More particularly, the present invention relates to an illuminating efficiency-increasable and light-erasable embedded memory device and a fabricating method thereof.

2. Description of the Prior Art

A memory is a semiconductor device used for storing data or information. The requirements for memory are getting higher and higher along with the advancement in the function of computer micro-processors and the increase in volume of software programs and calculations. The technique and the process for fabricating memory devices with large-volume and low-cost memory have been driving the semiconductor technology to go towards high integration constantly.

Among various memory products, a non-volatile memory has been applied widely to personal computers and other electronic equipment in which data can be read from, written to, or erased from the non-volatile memory repeatedly and the data stored in the non-volatile memory will not be lost after turning power off.

Figure 1:
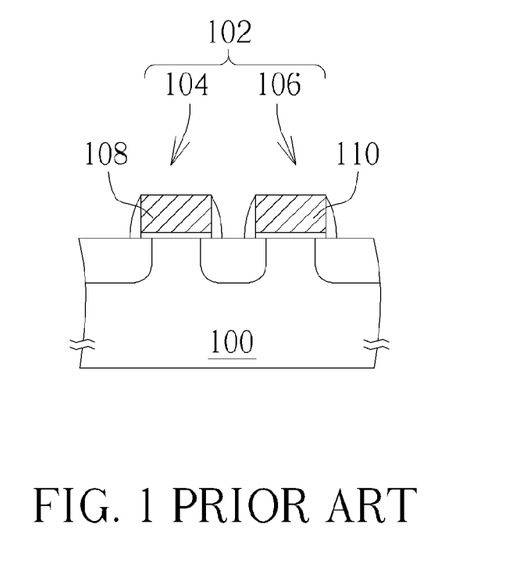
FIG. 1 is a cross-sectional view of a conventional single poly non-volatile memory device.

FIG. 1 is a cross-sectional view of a conventional single poly non-volatile memory device.

Referring to FIG. 1, a memory device 102 is disposed on a substrate 100. The memory device 102 includes two metal oxide semiconductor (MOS) transistors 104 and 106 disposed adjacently on the substrate 100, and the gates of the MOS transistors 104 and 106 are respectively used as a select gate 108 and a floating gate 110 of the memory device 102. While programming the memory device 102, charges are stored in the floating gate 110. While erasing the data stored in the memory device 102, conventionally, the floating gate 110 is radiated with a UV light so that the charges stored in the floating gate 110 can be erased.

If the memory device 102 is an embedded memory, a metal interconnect structure covers the memory device 102. In a metal interconnect structure adopting a copper process, the metal interconnect is composed of a plurality of copper metal layers formed in a plurality of dielectric layers, and a silicon nitride layer is formed on each dielectric layer as a cap layer for protecting the copper metal layer.

A one-time programmable read-only memory (OTPROM) is a non-volatile memory structure that may be programmed after the memory is manufactured. The OTPROM retains a programmed memory state even when no power is provided to the OTPROM. An OTPROM memory cell array typically includes one bitcell per data bit to be stored. Each row of bitcells in the OTPROM array may be coupled to a signal line known as a wordline. Each column of bitcells in the OTPROM array may be coupled to a signal line known as a bitline.

While the semiconductor device, such as CMOS, BJT, or diode, is mostly operated by electrical signals, how to integrate the OTPROM process which uses UV light to erase the stored electrons in the semiconductor process is still a challenge in the industry.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

It is a novel process concept to forma light permeable passage in the semiconductor device by using existing semiconductor processes with high process integration and less process step or cost.

In one aspect of the embodiments, there is provided a light-erasable embedded memory device consisted of a substrate with a memory region and a core circuit region, a floating gate on the memory region of the substrate, at least one light-absorbing film above the floating gate, wherein at least one light-absorbing film is provided with dummy via holes overlapping the floating gate, and a dielectric layer on the light-absorbing film and filling up the dummy via holes.

In another aspect of the embodiments, there is provided a method of manufacturing a light-erasable embedded memory device. The method includes following steps of providing a substrate with a memory region and a core circuit region, forming a floating gate on the memory region, forming at least one light-absorbing film above the floating gate over the memory region and the core circuit region, performing an etch process on the light-absorbing film to concurrently form dummy via holes and via holes in the light-absorbing film respectively above the memory region and the core circuit region, wherein the dummy via holes overlap the floating gate, and forming a dielectric layer over the light-absorbing film and filling up the dummy via holes and the via holes.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the embodiments. Note that the size, the thickness of films (layers), or regions in diagrams may be exaggerated for clarity.

Figure 2:
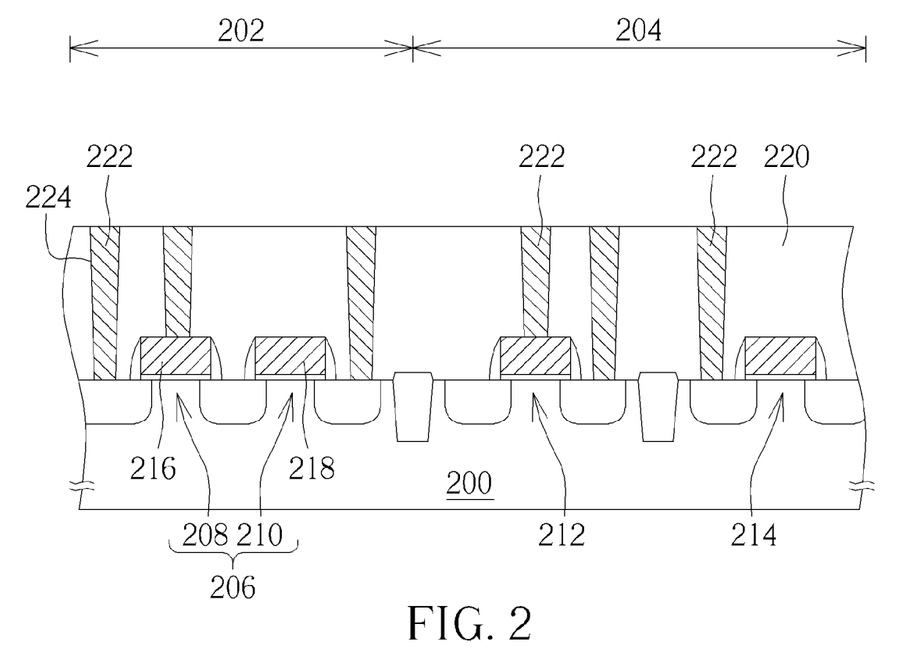
FIG. 2 illustrates a cross-sectional view of the light-erasable embedded memory device and MOS transistors respectively in a memory region and a core circuit region after front end of line (FEOL) stage according to one embodiment of the present invention.
Figure 3:
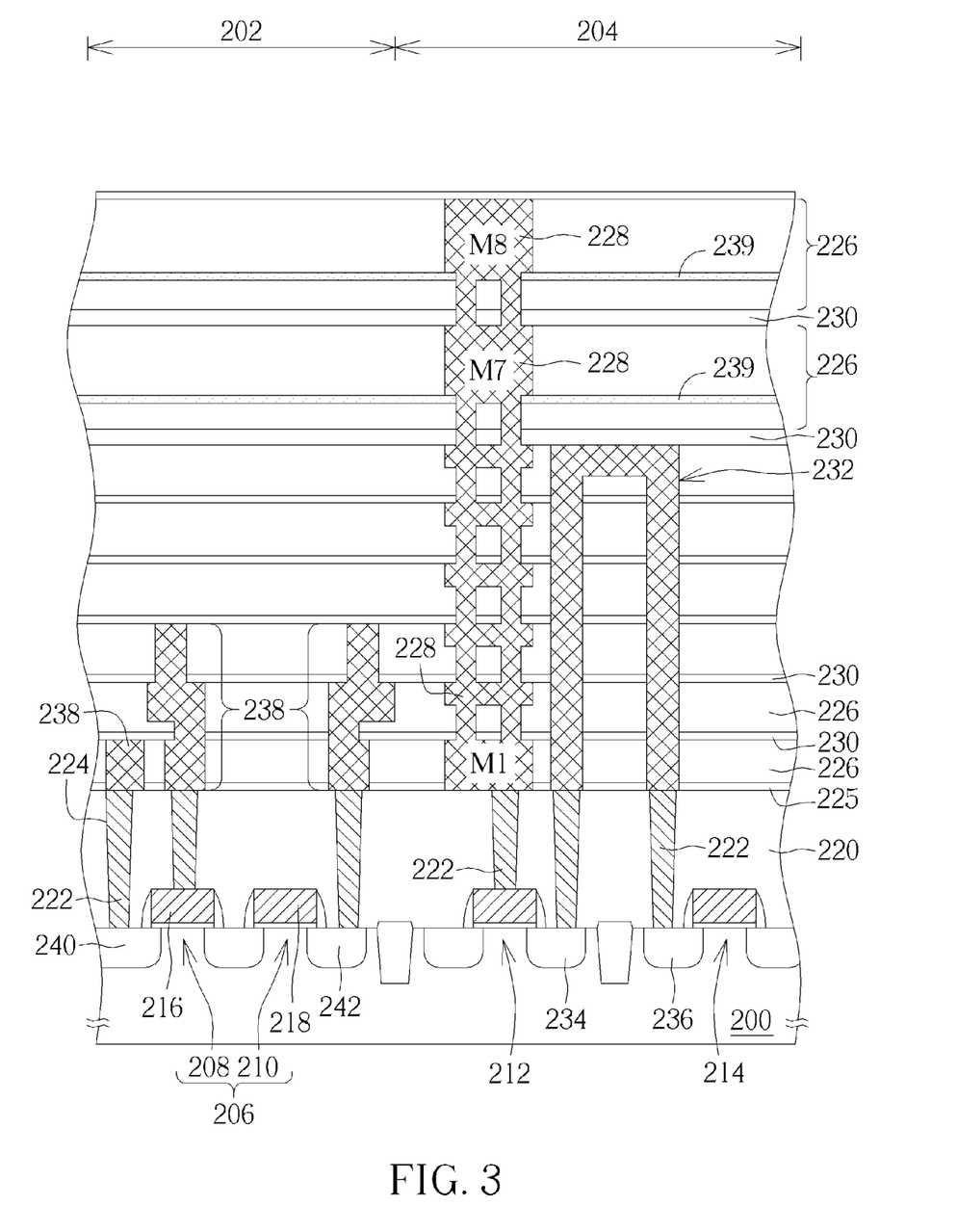
FIG. 3 illustrates a cross-sectional view of the light-erasable embedded memory device and MOS transistors respectively in a memory region and a core circuit region in the back end of line (BEOL) stage according to one embodiment of the present invention.
Figure 4:
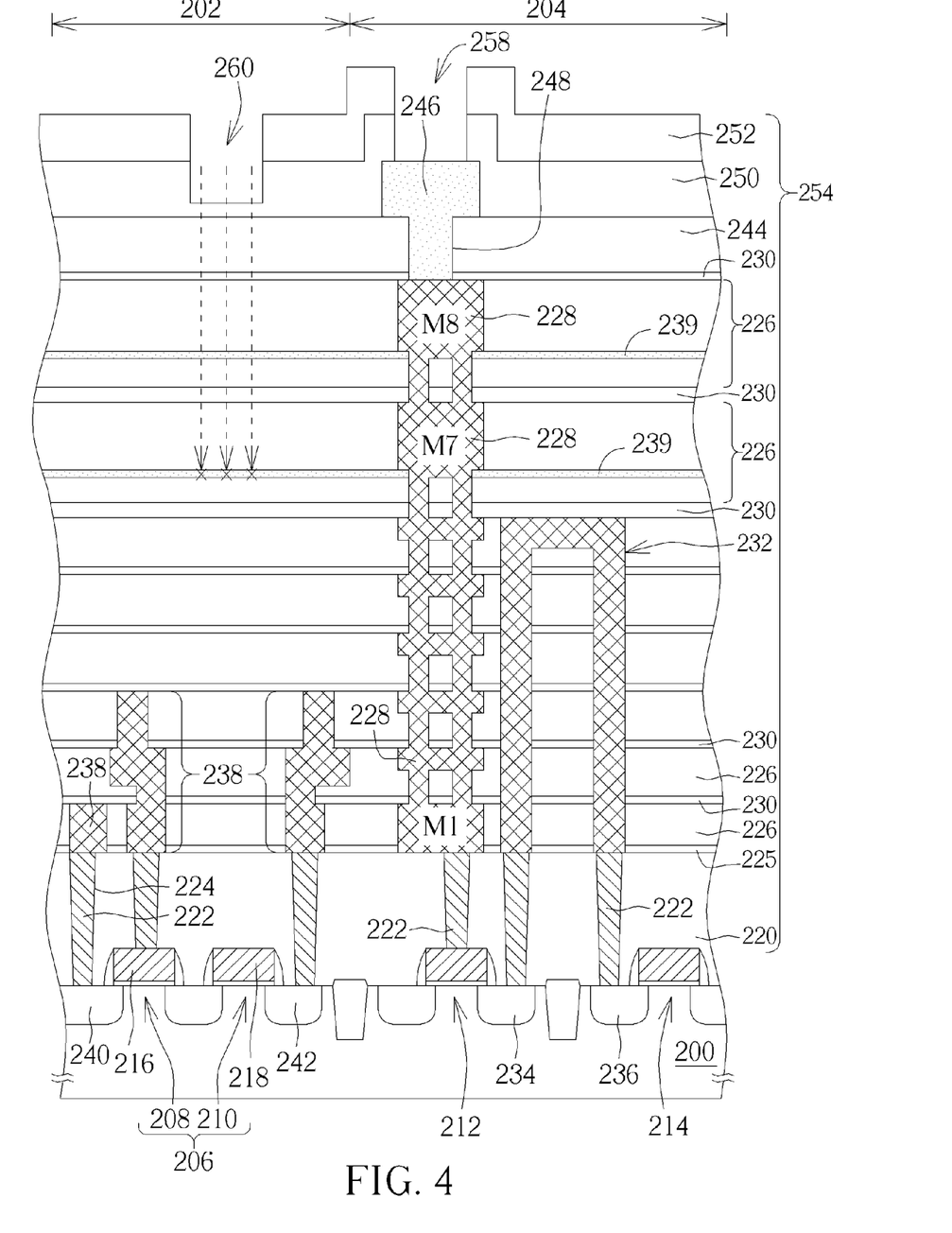
FIG. 4 illustrates a cross-sectional view of the light-erasable embedded memory device and MOS transistors respectively in a memory region and a core circuit region after the back end of line (BEOL) stage according to one embodiment of the present invention.

Hereinafter, a method of manufacturing an illuminating efficiency-increasable and light-erasable embedded memory device according to an embodiment of the present invention will be described with reference to FIGS. 2 to 4, which are cross-sectional views taken along a line transversal across the patterns of gate electrodes in memory region and logic region. In FIGS. 2 to 4, some components are enlarged, reduced in size, or omitted for easy understanding and preventing obscuring the subject matters of the present invention.

First, please refer to FIG. 2, which is a cross-sectional view of the memory devices and MOS transistors respectively in a memory region and a core circuit region after front end of line (FEOL) stage according to one embodiment of the present invention. A substrate 200 is provided first to serve as a base for forming the semiconductor devices. The substrate 200 includes a memory region 202 and a core circuit region 204, and a memory device 206 has been formed on the substrate 200 in the memory region 202. The substrate 200 may be a silicon substrate, for example. The memory device 206 may be composed of two MOS transistors 208 and 210 disposed adjacently on the substrate 200, wherein the gates of the MOS transistors 208 and 210 are respectively used as a select gate 216 a floating gate 218 of the memory device 206. Besides, MOS transistors 212 and 214 may be further formed on the substrate 200 in the core circuit region 204. The materials and methods for forming foregoing various components of the memory device 206 and of the MOS transistors 212, 214 are well-known to those having ordinary knowledge in the art, and therefore no further description will be provided herein.

Next, an interlayer dielectric (ILD) 220 is formed on the substrate 200 and covers the memory device 206 and the MOS transistors 212 and 214. The material of the interlayer dielectric 220 may be silicon dioxide or silicon nitride, and the formation method of the dielectric layer 220 may be chemical vapor deposition (CVD), for example.

Thereafter, a contact plug 222 is formed in the dielectric layer 220. The material of the contact plug 222 may be a metal such as tungsten, for example. The contact plug 222 may be formed by patterning the dielectric layer 220 first to form a plurality of openings 224 in the dielectric layer 220, and then performing a gap filling process to fill conductive materials into the openings 224. An additional contact etch stop film (not shown) may be formed conformally on the MOS transistor 208, 210 and the substrate 200 by SACVD, for example.

Next, please refer to FIG. 3, which is a cross-sectional view of the light-erasable embedded memory device and MOS transistors respectively in a memory region and a core circuit region in back end of line (BEOL) stage according to one embodiment of the present invention. A light absorbing film 225 is first formed on the dielectric layer 220 to prevent the UV light being reflected. The light absorbing film 225 may be formed of silicon oxynitride (SiON) material with a thickness about 400 Å (angstrom) by PECVD. A dielectric layer 226 is formed on the light absorbing film 225. The material of the dielectric layer 226 may be silicon oxide or low-K fluorosilicate glass (FSG) with a thickness about 5000 Å, and the formation method of the dielectric layer 226 may be CVD, for example.

After that, a metal layer 228 is formed in the dielectric layer 226 and through the light absorbing film 225, and the metal layer 228 may be used as a metal interconnect structure. The material of the metal layer 228 may be copper, and the metal layer 228 may be formed through a metal damascene process, for example.

Next, a cap film 230 is formed on the dielectric layer 226. The material of the cap film 230 may be silicon nitride, more specifically, UV-transparent silicon nitride (UV-SiN) with a thickness about 700 Å. The formation method of the cap film 230 may be CVD, for example.

Moreover, the foregoing steps for forming the dielectric layer 226, the metal layer 228, and the cap film 230 are repeated for at least several times depending on the number of the metal layers. In the present embodiment, these steps are repeated five times; however, the number of times for forming the dielectric layer 226, the metal layer 228, and the cap film 230 and the thicknesses of the three layers may be changed according to the design of the metal interconnect structure by those having ordinary knowledge in the art.

Furthermore, while repeating the steps of forming the dielectric layer 226, the metal layer 228, and the cap film 230, a fuse structure 232 may be formed in the dielectric layer 226 and through each cap film 230. The fuse structure 232 may be coupled to a doped region 234 of the MOS transistor 212 and a doped region 236 of the MOS transistor 214 via the contact plug 222. The material of the fuse structure 232 may be copper, and the fuse structure 232 may be formed through the metal damascene process, for example. The fuse structure 232 can be adopted for repairing circuits by utilizing a laser beam to radiate the fuse structure 232. As such, there are no other metal layers above the fuse structure 232. Moreover, as the laser beam is employed for repairing the circuits, the opening is usually reserved on top of the fuse structure 232 in favor of repairing the circuits through the laser beam.

In addition, while forming the dielectric layer 226, the metal layer 228, and the cap film 230 repeatedly, a conductive wire 238 may be formed in the dielectric layer 226 at the same time, and the conductive wire 238 may be respectively coupled to the doped regions 240, 242 and the select gate 216 of the memory device 206 via the contact plug 222. The material of the conductive wire 238 may be copper, and the conductive wire 238 may be formed through the metal damascene process, for example.

In the level with ultra-thick metal layer 228 (e.g., with a thickness of 35K Å), such as M7 and M8 shown in FIG. 1, the size of the metal layer (pattern) 228 is so large such that high energy exposure is required in the photolithographic process to properly define the metal pattern. With such high energy exposure, the incident light is much easier to be reflected by the underlying layers, such as the light-reflecting metal layer (i.e. the metal layer in M6) right below in the condition that adjacent layers are not particularly light-absorbing. The reflected light would cause an abnormal exposure and change the dimension of the metal layer, which is referred herein as a necking issue.

In order to solve this issue, it is shown in FIG. 1 that M7 and M8 levels with ultra-thick metal layer 228 are particularly provided with an intermediate light-absorbing film 239 amid the dielectric layer 226, more specifically, in the bottom level of the ultra-thick metal layer 228, to absorb the incident light and/or the reflected light. The material of the light-absorbing film 239 may be silicon oxynitride (SiON) with a thickness about 900 Å. The formation method of the light-absorbing film 239 may be CVD, for example. With light-absorbing film 239 disposed therebetween, a portion of the high energy incident light will be absorbed and make it less reflective by the underlying layer.

Next, please refer to FIG. 4, which is a cross-sectional view of the light-erasable embedded memory device and MOS transistors respectively in a memory region and a core circuit region after the back end of line (BEOL) stage according to one embodiment of the present invention. A thick dielectric layer 244 is formed on the cap film 230. The material of the dielectric layer 244 may be silicon oxide with a thickness about 12K Å, and the formation method of the dielectric layer 244 may be CVD, for example.

Thereafter, a pad 246 is formed in the dielectric layer 244, and the pad 246 is coupled to the metal layer 228 in M8 level. The material of the pad 246 may be aluminum (Al), and the pad 246 may be formed through forming an opening 248 in the dielectric layer 244 and forming a pad material layer on the dielectric layer 244 to fill the opening 248. After that, a photolithography process and an etching process are performed to define the pad 246. In another embodiment, the pad 246 may also be constructed by performing the metal damascene process.

Afterwards, a dielectric layer 250 is formed on the dielectric layer 244 and covers the pad 246. The material of the dielectric layer 250 may be phosphosilicate glass (PSG) with a thickness about 4K Å, and the dielectric layer 250 may be formed by CVD.

Next, a passivation layer 252 is formed on the dielectric layer 250. The material of the passivation layer 252 may be silicon nitride with a thickness about 5K Å, and the formation method of the passivation layer 252 may be CVD.

In the present embodiment, the metal interconnect structure 254 may be composed of the dielectric layer 220, the contact plug 222, a layer stack including the plurality of dielectric layers 226, the metal layers 228 and the cap films 230, and the fuse structure 232, the conductive wire 238, the dielectric layer 244, the pad 246, the dielectric layer 250, and the passivation layer 252, for example.

In addition, an opening 258 may be formed in the dielectric layer 250 and the passivation layer 252 above the pad 246 of the metal interconnect structure 254. The opening 258 exposes the pad 246, such that the pad 246 can be coupled to external conductive wires (not shown). Furthermore, an opening 260 may be formed in the dielectric layer 250 and the passivation layer 252 right above the region of the floating gate 210. The opening 260 is prepared for UV erase. By the removal of a portion of the top dielectric layer 250 and the passivation layer 252, the UV light will more readily reach the floating gate 210 and achieve the erase actions.

However, as shown in FIG. 4, the two thick light-absorbing films 239 (e.g. with a total thickness over 2000 Å) amid in the (ultra thick metal) UTM level of the layer stack for solving the necking issue may completely obstruct the incident UV light and fail the data erase process.

Figure 5:
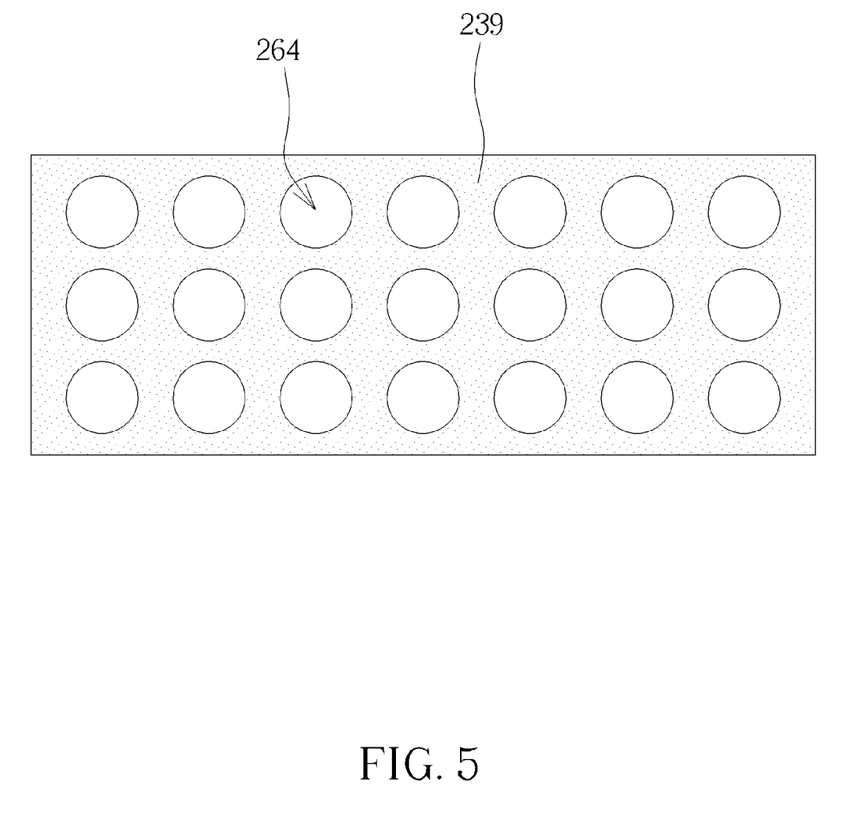
FIG. 5 illustrates a schematic top view of the light-absorbing film with pattern of dummy via holes according to one embodiment according to one embodiment.

In order to solve this problem, the present invention provides a novel layer structure and a method which may facilitate the data erase process in the floating gate while the conventional UTM necking issue may still be prevented. Please refer to FIG. 5, which is a top view of the light-absorbing film 239 shown in FIG. 4. The solution to the UV erase fail issue is to form multiple dummy via holes 264 in the light-absorbing films 239 right above the floating gate 210 in the memory region 202. Each dummy via hole 264 is made for allowing the incident UV light to pass therethrough without being absorbed or blocked by the light-absorbing films 239. The dummy via holes 239 shown in FIG. 4 are formed in array order. This may enable the UV light to be uniformly spread on the floating gate region. In the embodiment of the present invention, the dummy via holes 264 may be formed in light-absorbing film 239 of M7 level or M8 level, both of them, or even M1 level, depending on the requirement of the process.

Figure 6A:
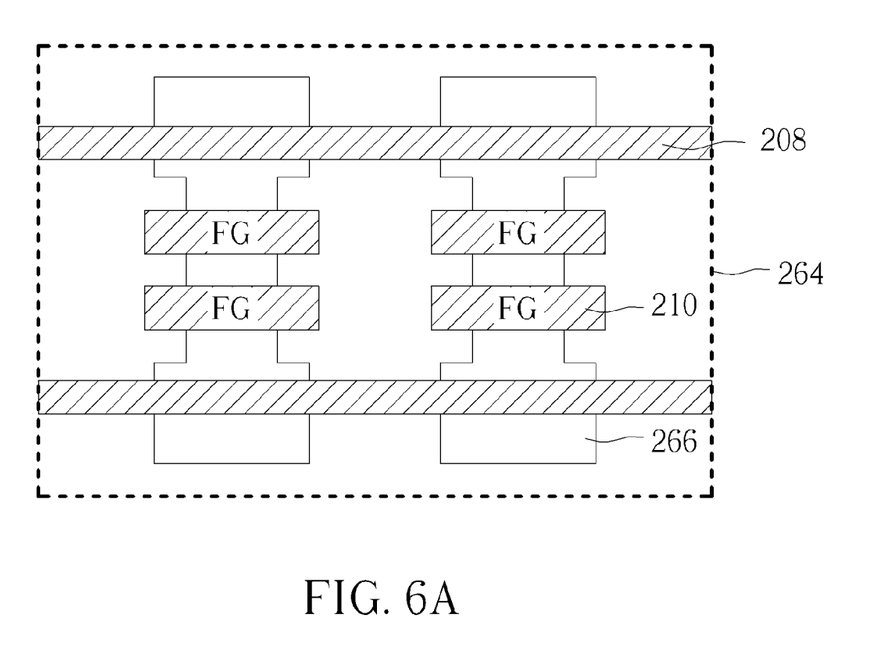
FIGS. 6a-6d are top views schematically showing several exemplary patterns of how the dummy via holes are distributed above the floating gate.
Figure 6B:
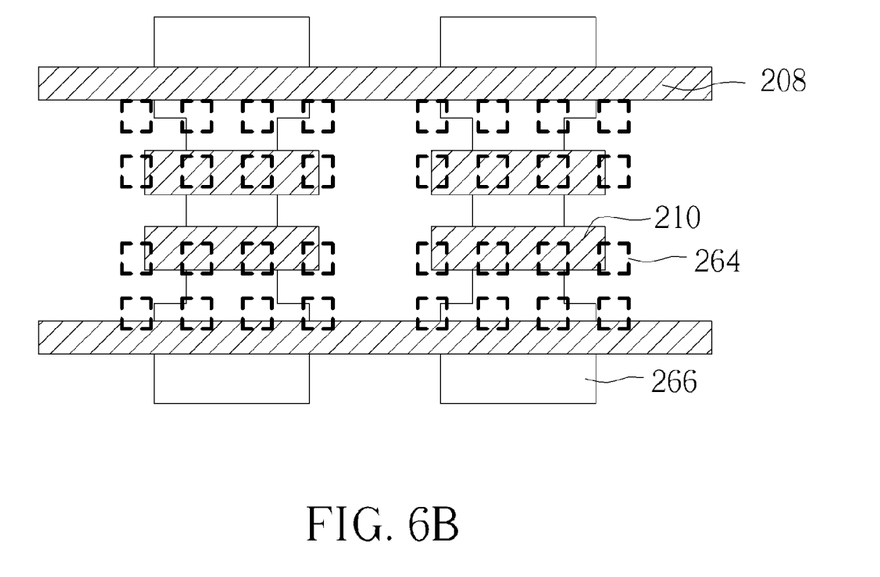
Figure 6C:
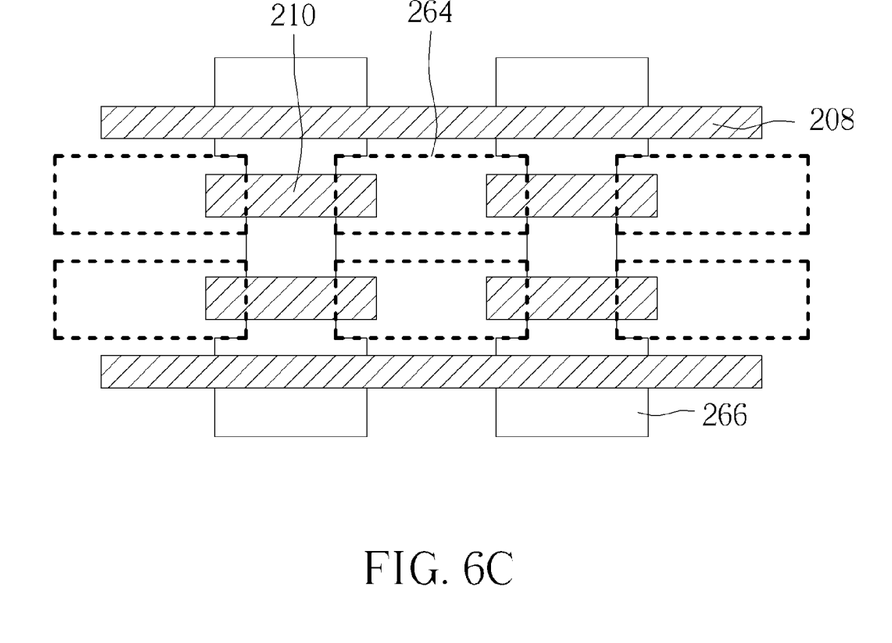
Figure 6D:
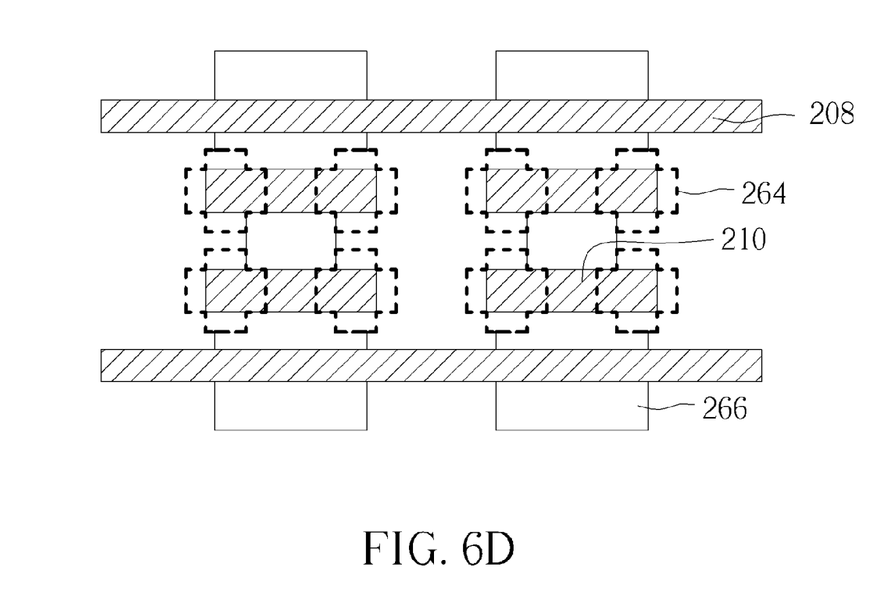
Figure 7:
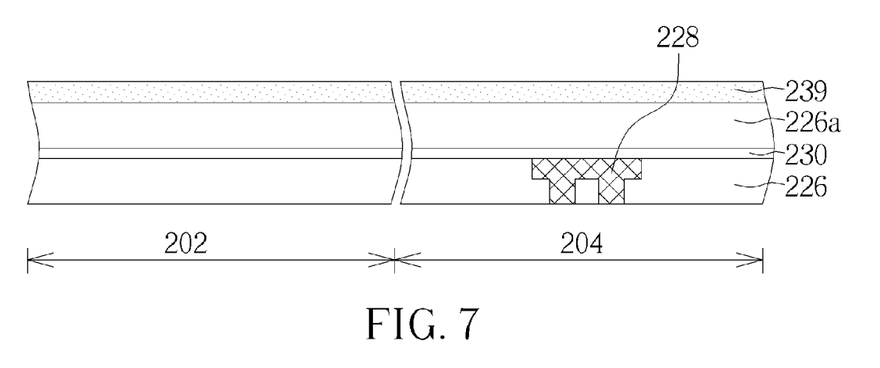
FIGS. 7-10 are cross-sectional views illustrating a manufacturing flow of an illuminating efficiency-increasable and light-erasable embedded memory device according to an embodiment of the present invention.

The dummy via holes 264 may be distributed above the region of floating gate 210 in different patterns. FIGS. 6A-6D shows several exemplary patterns of how the dummy via holes are distributed above the floating gate 210. In FIG. 6A, the dummy via hole 264 is one large rectangular opening spreading over all floating gates 210 in the region, including adjacent select gates 208 and the active areas 266 formed below. In FIG. 6B, the dummy via holes 264 are uniformly distributed in array order over the floating gates 210 in the region. In FIG. 6C, the dummy via holes 264 spread only above two ends of the floating gates 210. In FIG. 6C, the dummy via holes 264 are rectangular patterns spreading and extending between opposite ends of two adjacent floating gates 210. In FIG. 6D, the dummy via holes 264 are cross patterns distributed only above two ends of the floating gates 210. The principle of the present invention is to form dummy via holes 264 above the floating gates, either partially overlaying or entirely overlaying, as long as the UV light may reach the gate region to fulfill the purpose of data erase.

Next, the process of forming the dummy via holes 264 amid the dielectric layer 226 will be explicitly described with reference to FIGS. 7-10. Please note that FIGS. 7-10 mainly illustrate the structure of UTM level (e.g. M7 and M8) in which the dummy via holes are formed. The structures of other metal level are omitted in the figures for simplicity of description and not to obscure the subject matter of the present invention. The process flow is started from a layer stack including the dielectric layer 226 and a M6 metal layer 228 formed within, a cap film 230 over the dielectric layer 226, a dielectric layer 226a on the cap film 230, and a light absorbing film 239 on the dielectric layer 226a. The substrate is divided into the memory region 202 with the floating gate 210 form thereon and the core circuit region 204 where the ultra thick metal will be formed in subsequent processes.

Figure 8:
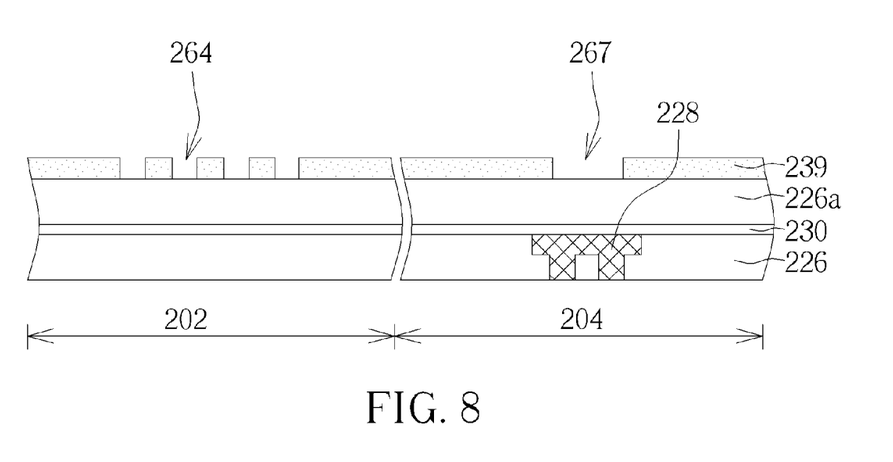

Next, please refer to FIG. 8, an etch process is performed with patterned photoresist (not shown) as a mask to concurrently form the dummy via holes 264 and a via hole 267 respectively in the memory region 202 and the core circuit region 204. The dummy via holes 264 are formed to allow the passing of the UV light in the data erase process, and the via hole 267 will be filled with metal material to form the via of the UTM structure. The dummy via holes 264 are formed above and at least partially overlap the floating gate of the memory region 202, while the via hole 267 is formed above the metal line in the core circuit region 204. It should be noted that the formation of the dummy via holes 264 may be integrated into the process of common logic circuit without increasing the process step, time, or manufacturing cost.

Figure 9:
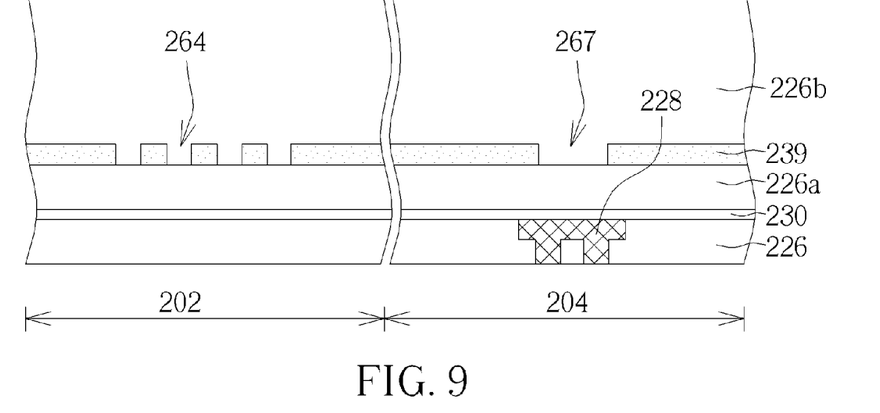

Next, please refer to FIG. 9, in which a thick dielectric layer 226b is formed on the light absorbing film 239. Please note that the dummy via holes 264 in memory region 202 and the via hole 267 in core circuit region 204 are filled up by dielectric layer 226b. The dielectric layer 226 denoted in previous figures may be considered as a combination of dielectric layer 226a and thick dielectric layer 226b. The dielectric layer 226b is a thick layer with a thickness of about 36K Å for the UTM structure.

Figure 10:
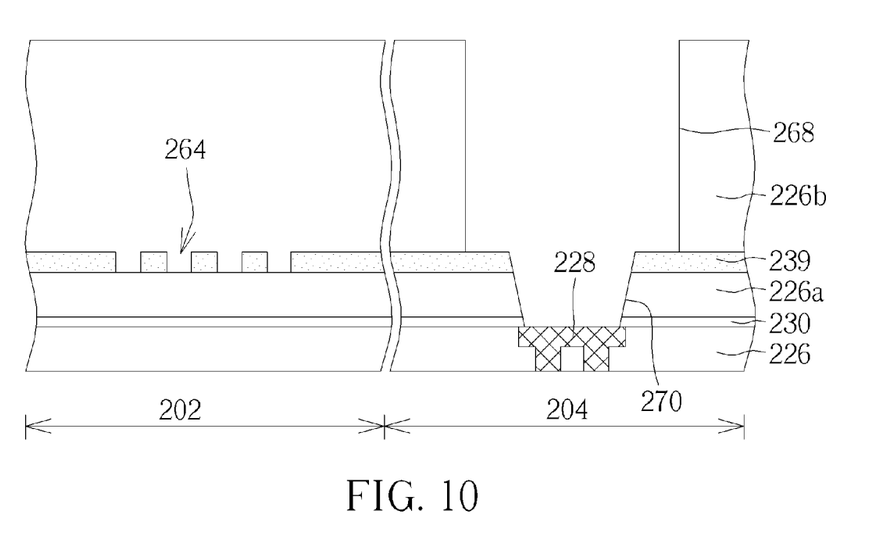

Next, please refer to FIG. 10. After the thick dielectric layer 226b is formed, a recess 268 is formed in the thick dielectric layer 226b above the core circuit region 204. The recess 268 may be formed by using a photolithographic process and an etch process to define the UTM pattern. It should be noted that, the etch process also removes a portion of the light absorbing film 239 and underlying dielectric layer 226a and cap film 230. Since the via hole 267 (FIG. 7) is formed before the etch process, the etch process would form an opening 270 in the dielectric layer 226a and cap film 230 and expose the metal layer 228 below.

Figure 11:
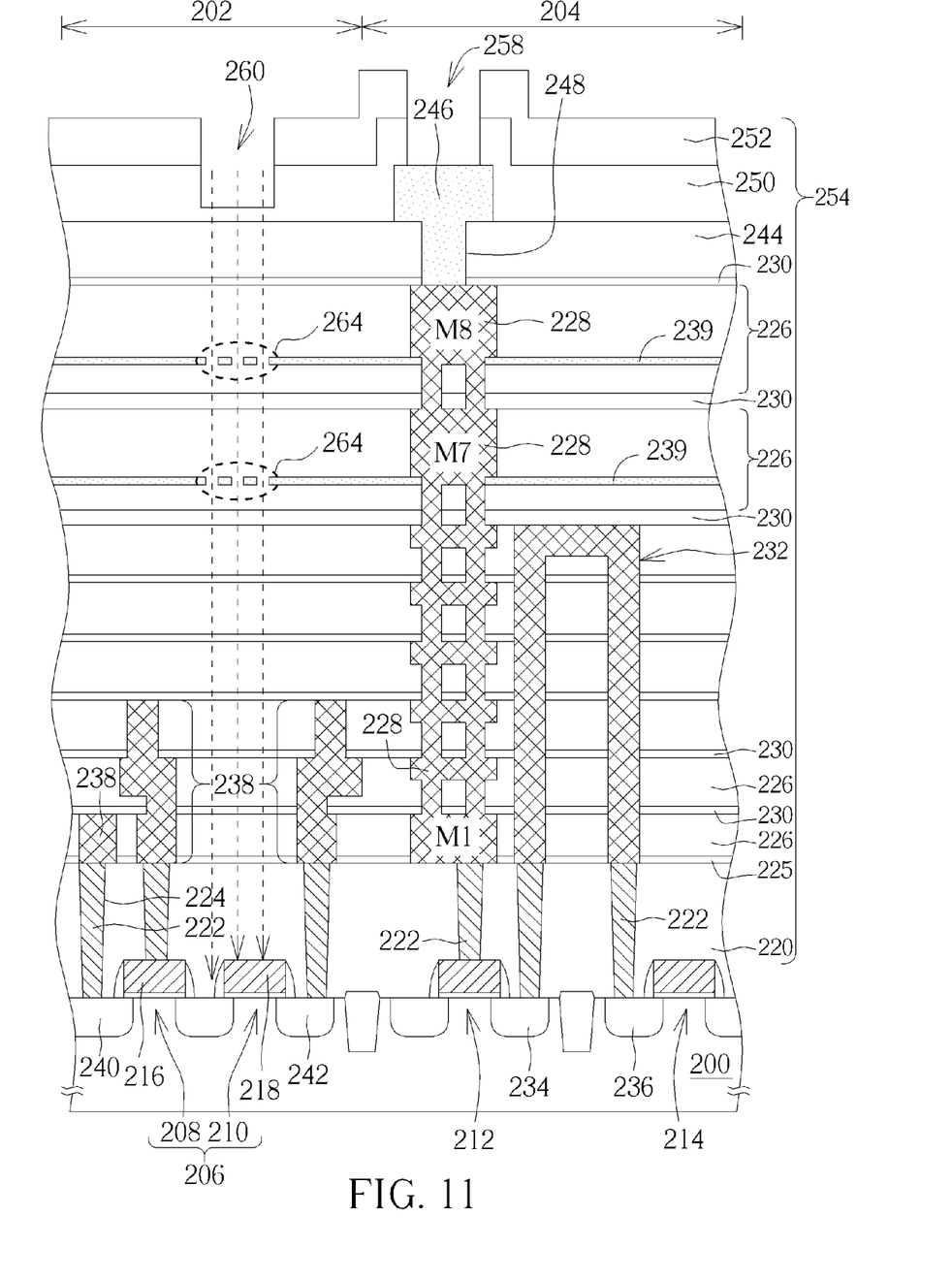
FIG. 11 illustrates a cross-sectional view showing the UV light passes thought the dummy via holes and reaches the floating gate according to one embodiment of the present invention.

Last, as it is shown in FIG. 11, with the dummy via holes 264 formed in the light absorbing film 239 amid the thick dielectric layer 226 in UTM level above the memory region 202, the UV light may reach the floating gate 218 and erase the stored data, while the UTM necking issue may still be prevented by the light absorbing film 239 to absorb excess UV light.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light-erasable embedded memory device, comprising:
   a substrate with a memory region and a core circuit region;
   a floating gate on said memory region of said substrate;
   at least one light-absorbing film above said floating gate over said memory region and said core circuit region, wherein at least one said light-absorbing film is provided with a plurality of dummy via holes overlapping said floating gate; and
   a dielectric layer on said light-absorbing film and filling up said dummy via holes.

2. The light-erasable embedded memory device of claim 1, wherein said dummy via holes are arranged in an array.

3. The light-erasable embedded memory device of claim 1, wherein the material of said light-absorbing film is silicon oxynitride (SiON) or silicon nitride (SiN) with relatively low transmission coefficient for UV light.

4. The light-erasable embedded memory device of claim 1, further comprising an ultra thick metal on said core circuit region of said substrate, wherein said ultra thick metal forms in said light-absorbing film and said dielectric layer.

5. The light-erasable embedded memory device of claim 1, wherein the material of said dielectric layer is fluorosilicate glass (FSG).

6. The light-erasable embedded memory device of claim 1, wherein said memory region is a one-time programming (OTP) region.

7. A method of manufacturing a light-erasable embedded memory device, comprising steps of:
   providing a substrate with a memory region and a core circuit region;
   forming a floating gate on said memory region of said substrate;
   forming at least one light-absorbing film above said floating gate over said memory region and said core circuit region;
   forming a plurality of dummy via holes and via holes concurrently in said light-absorbing film respectively above said memory region and said core circuit region, wherein said plurality of dummy via holes overlap said floating gate on said memory region; and
   forming a dielectric layer over said light-absorbing film and filling up said dummy via holes and said via holes.

8. The method of manufacturing a light-erasable embedded memory device of claim 7, further comprising a step of performing an etch process on said core circuit region to form a recess in said light-absorbing film and said dielectric layer.

9. The method of manufacturing a light-erasable embedded memory device of claim 7, further comprising a step of filling up said recess in said light-absorbing film and said dielectric layer with metal material to form a metal layer.

10. The method of manufacturing a light-erasable embedded memory device of claim 9, wherein said metal layer is an ultra-thick metal (UTM).

11. The method of manufacturing a light-erasable embedded memory device of claim 7, further comprising a step of irradiating UV light passing through said dummy via holes and reaching said floating gate to erase storage data.

12. The method of manufacturing a light-erasable embedded memory device of claim 7, wherein said memory region is a one-time programming (OTP) region.

13. The light-erasable embedded memory device of claim 1, wherein said at least one light-absorbing film comprises a plurality of said light-absorbing films, and each said light-absorbing films is provided with a plurality of dummy via holes completely overlapping said dummy via holes of other said light-absorbing films and said floating gate.

14. The method of manufacturing a light-erasable embedded memory device of claim 7, wherein said at least one light-absorbing film comprises a plurality of said light-absorbing films, and each said light-absorbing films is provided with a plurality of dummy via holes completely overlapping said dummy via holes of other said light-absorbing films and said floating gate.

\* \* \* \* \*